(12) United States Patent
Lovett

(10) Patent No.: US 7,506,126 B2
(45) Date of Patent: *Mar. 17, 2009

(54) DETECTION CIRCUIT FOR MIXED ASYNCHRONOUS AND SYNCHRONOUS MEMORY OPERATION

(75) Inventor: Simon J. Lovett, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/354,786

(22) Filed: Feb. 14, 2006

(65) Prior Publication Data

US 2006/0136692 A1    Jun. 22, 2006

Related U.S. Application Data

(63) Continuation of application No. 11/129,150, filed on May 13, 2005, now Pat. No. 7,320,049, which is a continuation of application No. 10/357,862, filed on Feb. 3, 2003, now Pat. No. 6,920,524.

(51) Int. Cl.
*G06F 12/00* (2006.01)

(52) U.S. Cl. .................. 711/167; 711/100; 711/105; 711/106; 711/111; 711/157; 711/158; 711/166; 365/194; 365/222; 365/233.5; 327/26; 327/166; 327/176

(58) Field of Classification Search ......... 711/166–167, 711/100, 105–106, 111, 157–158; 365/194, 365/222, 233; 327/26, 166, 176
See application file for complete search history.

(56) References Cited

U.S. PATENT DOCUMENTS 4,293,926 A    10/1981  Amano .................. 364/900

4,347,617 A  *  8/1982  Murano et al. ........... 375/238

(Continued)

FOREIGN PATENT DOCUMENTS

JP    411238380 A    8/1999

(Continued)

OTHER PUBLICATIONS

"Intel® 1.8 Volt Wireless Flash Memory (W18/W30)," Product Brief Flash Products Group, Intel Corporation, 2002, pp. 1-2.

(Continued)

*Primary Examiner*—Sanjiv Shah
*Assistant Examiner*—Zhuo H Li
(74) *Attorney, Agent, or Firm*—Dorsey & Whitney LLP

(57) ABSTRACT

A memory access mode detection circuit and method for detecting and initiating memory access modes for a memory device The memory access mode detection circuit receives the memory address signals, the control signals, and the clock signal and generates a first mode detection signal in response to receipt of the memory address signals or a first combination of control signals. An first mode initiation signal is generated a time delay subsequent to the detection signal to initiate the first mode memory access operation. In response to receipt of a second combination of control signals and an active clock signal, the memory access mode detection circuit further generates a second mode detection signal to initiate a second mode memory access operation and to suppress generation of the first mode detection signal, thereby canceling the first mode memory access operation.

21 Claims, 5 Drawing Sheets

U.S. PATENT DOCUMENTS

| | | | |
|---|---|---|---|
| 5,258,952 A | 11/1993 | Coker et al. | 365/194 |
| 5,374,894 A | 12/1994 | Fong | 327/14 |
| 5,471,157 A | 11/1995 | McClure | 326/93 |
| 5,510,740 A * | 4/1996 | Farrell et al. | 327/142 |
| 5,566,129 A | 10/1996 | Nakashima et al. | 365/233.5 |
| 5,600,605 A | 2/1997 | Schaefer | 365/233 |
| 5,666,321 A * | 9/1997 | Schaefer | 365/233.5 |
| 5,802,555 A | 9/1998 | Shigeeda | 711/106 |
| 5,805,517 A | 9/1998 | Pon | 365/212 |
| 5,835,440 A | 11/1998 | Manning | 365/230.06 |
| 5,933,369 A * | 8/1999 | Johnson et al. | 365/189.05 |
| 6,058,070 A | 5/2000 | La Rosa | 365/233.5 |
| 6,075,751 A | 6/2000 | Tedrow | 365/233.5 |
| 6,166,990 A | 12/2000 | Ooishi et al. | 365/233 |
| 6,240,045 B1 * | 5/2001 | Haraguchi et al. | 365/233 |
| 6,373,303 B2 | 4/2002 | Akita | 327/156 |
| 6,385,688 B1 * | 5/2002 | Mills et al. | 711/103 |
| 6,396,758 B2 | 5/2002 | Ikeda et al. | 365/222 |
| 6,507,532 B1 * | 1/2003 | Fujino et al. | 365/230.03 |
| 6,564,285 B1 | 5/2003 | Mills et al. | 711/103 |
| 6,597,615 B2 | 7/2003 | Mizugaki | 365/222 |
| 6,636,449 B2 | 10/2003 | Matsuzaki | 365/222 |
| 6,658,544 B2 * | 12/2003 | Gray | 711/167 |
| 6,675,256 B1 | 1/2004 | Harrand | 711/105 |
| 6,690,606 B2 | 2/2004 | Lovett et al. | 365/194 |
| 6,701,419 B2 | 3/2004 | Tomaiuolo et al. | 711/157 |
| 6,714,479 B2 | 3/2004 | Takahashi et al. | 365/233.5 |
| 6,741,515 B2 | 5/2004 | Lazar et al. | 365/222 |
| 6,920,524 B2 * | 7/2005 | Lovett | 711/106 |
| 2002/0087817 A1 * | 7/2002 | Tomaiuolo et al. | 711/157 |
| 2004/0141397 A1 | 7/2004 | Lovett et al. | 365/230.01 |
| 2005/0207254 A1 * | 9/2005 | Lovett | 365/222 |

OTHER PUBLICATIONS

"1.8 Volt Intel® Wireless Flash Memory (W18)," Datasheet, Intel Corporation, Jan. 2003, pp. 1-102.

* cited by examiner

DETECTION CIRCUIT FOR MIXED ASYNCHRONOUS AND SYNCHRONOUS MEMORY OPERATION

CROSS-REFERENCE TO RELATED APPLICATIONS

This application is a continuation of U.S. patent application Ser. No. 11/129,150, filed May 13, 2005 now U.S. Pat. No. 7,320,049, which is a continuation of U.S. patent application Ser. No. 10/357,862, filed Feb. 3, 2003, issued Jul. 19, 2005 as U.S. Pat. No. 6,920,524 B2.

TECHNICAL FIELD

The present invention is related generally to the field of integrated circuits, and more particularly, to circuitry for detecting asynchronous and synchronous memory operations in a memory device.

BACKGROUND OF THE INVENTION

A class of memory devices called pseudo-static memory are typically memory devices that are functionally equivalent to static random access memory (SRAM) devices, but have a memory core based on conventional dynamic random access memory (DRAM) cells. In general, these memory devices can be operated in the same manner one would operate a conventional SRAM. As is well known in the art, a major distinction between the two types of memory cells is that DRAM memory cells need to be periodically refreshed to maintain the stored data, whereas SRAM memory cells do not. Consequently, pseudo-static memory devices include internal refresh circuitry to perform the necessary refresh operations of the DRAM memory core. However, refresh operations are transparent to the user, so that the devices appear as not needing refresh operations.

Although there appear to be disadvantages in employing a DRAM memory core over an SRAM memory core because of the need for periodic refresh operations to be performed, there are, however, significant advantages in other respects. For example, memory density for a DRAM memory array can be much greater than that for a SRAM memory array. In the case of a DRAM memory cell, only one transfer gate and a storage device, typically a capacitor, is necessary to store one bit of data. In contrast, conventional SRAM memory cells can have as many as six transistors per memory cell. Additionally, the simple structure and smaller size of DRAM memory cells translate into less complicated manufacturing processes, and consequently, lower fabrication costs when compared to the SRAM memory cell. In turn, memory devices employing DRAM memory cores are considerably cheaper than SRAM memory devices having equivalent memory capacities.

In an effort to integrate a DRAM memory core into a memory device that is functionally equivalent to an SRAM device, the operational differences between the two types of memory need to be addressed. For example, one difference, as previously discussed, is that DRAM memory cells need to be refreshed periodically or the data stored by the memory cells will be lost. As a result, additional circuitry must be included in the memory device to support refresh operations, but should maintain refresh transparency to the user.

Another difference between an SRAM memory core and a DRAM memory core is that once a memory access operation for a conventional DRAM memory core has begun, the entire access cycle needs to be completed or data will be lost. That is, a DRAM access cycle begins with a row of memory cells in the array being activated, and the respective charge state of the memory cells for the activated row are sensed and amplified. A particular memory cell is selected by coupling a column to an input/output line. Consequently, the memory cell at the intersection of the activated row and the selected column is accessed. At this time, data can be read from or written to the particular memory cell. Following the read or write operation, the row of memory cells is deactivated, thus, the charge states that were initially sensed and amplified are stored by the respective capacitors of the memory cells. As is generally known, the process of sensing the charge state of the memory cells is destructive. Unless the DRAM access cycle is completed by amplifying the charge state and properly deactivating the row, the data stored by the memory cells of the activated row will be lost.

In contrast, for a conventional asynchronous SRAM memory device, the SRAM sense operation is non-destructive and does not have the same type of access cycle as a conventional DRAM memory device. Consequently, random memory addresses may be asserted to the SRAM memory device without timing restriction, and data is always expected to be returned in a certain time thereafter. This time is typically referred to as the address access time $t_{AA}$.

Yet another difference between memory devices having an SRAM memory core and those having a DRAM memory is that access times for DRAM memory cores are generally longer than the access times for SRAM memory cores. Asynchronous access of a DRAM memory core requires more time to provide valid data because of the time required to complete the access cycle. Although conventional DRAM devices often provide advanced access modes to decrease average access times, such as page mode access, valid memory addresses must nevertheless be provided for each data access. As a result, the minimum access time of a memory device will be limited by the setup time for providing valid and stable memory addresses, which in some cases, can take a relatively long time.

Synchronous DRAM (SDRAM) devices, which operate according to a periodic clock signal and have pipelined architectures to provide shorter average access times than asynchronous DRAM devices. Memory access times for SDRAM devices are generally lower because the pipelining of internal memory operations allow for different stages of a DRAM memory access operation to be executed in parallel, as well known in the art. This allows for new memory commands to be initiated prior to the completion of previous memory commands. As a result, conventional SDRAM devices can provide modes of operation that cannot be replicated by their asynchronous DRAM counterparts. For example, SDRAM devices have a data burst mode where new data can be output each period of a clock signal after an initial memory access without the need to provide any memory addresses other than for the first memory location. That is, data stored at the starting memory location is accessed, and data from sequential memory locations are thereafter accessed without the need to provide further memory addresses.

Despite the aforementioned disadvantages, in many instances, it is still desirable to employ memory devices having a DRAM memory core for the advantages previously discussed. Therefore, it is desirable to have circuitry that can be employed in a memory device that provides the asynchronous functionality of an SRAM device, and which accommodates the scheduled events of accessing a DRAM memory core. Moreover, in many applications, it is desirable for the circuitry to automatically detect whether an asynchronous or synchronous memory access operation is requested without the use of a flag or dedicated control signal that instructs the memory device to expect an asynchronous or synchronous memory access operation. In this manner, a memory device having such circuitry can be used as a companion device with existing types of conventional memory devices.

DETAILED DESCRIPTION OF THE INVENTION

In the following detailed description of exemplary embodiments of the invention, reference is made to the accompanying drawings, which form a part hereof, and in which are shown, by way of illustration, specific exemplary embodiments in which the invention may be practiced. In other instances, well-known circuits, control signals, and timing protocols have not been shown in detail in order to avoid unnecessarily obscuring the invention. These embodiments are described in sufficient detail to enable those skilled in the art to practice the invention. Other embodiments may be utilized and modifications may be made without departing from the spirit or scope of the present invention. The following detailed description is, therefore, not to be taken in a limiting sense, and the scope of the present invention is defined only by the appended claims.

Figure 1:
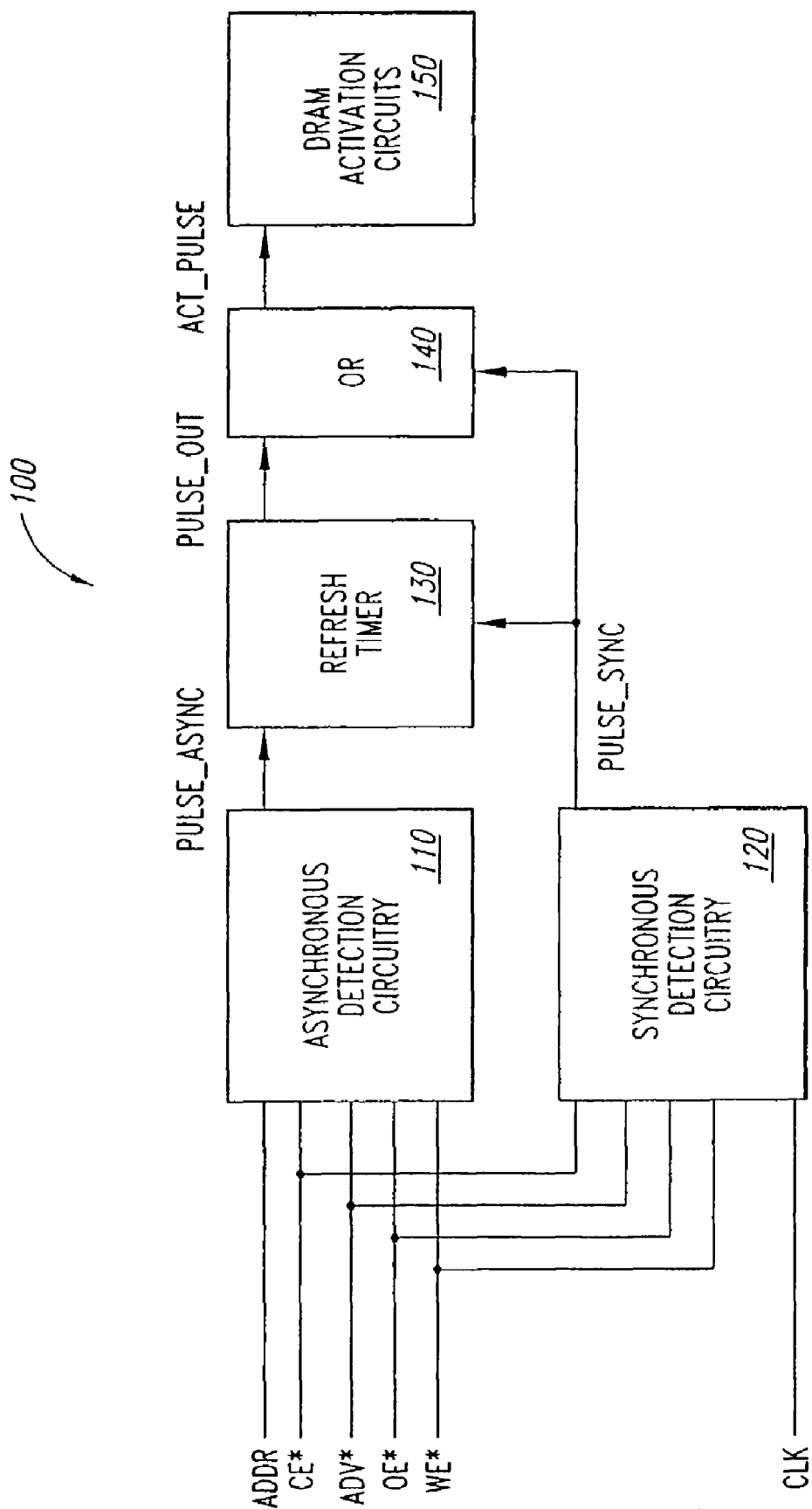
FIG. 1 is a functional block diagram of an asynchronous/synchronous detection circuit according to an embodiment of the present invention.

FIG. 1 illustrates an asynchronous/synchronous mode detection circuit 100 according to an embodiment of the present invention. The detection circuit 100 can be employed in a memory device that is functionally equivalent to an SRAM device, but uses a DRAM memory core. As will be explained in more detail below, a significant benefit provided by embodiments of the present invention is the automatic detection of synchronous/asynchronous operation. The detection circuit 100 also allows for the memory device to be operated synchronously as well. Included in the detection circuit 100 is asynchronous mode detection circuitry 110 to which address signals ADDR<0:n> and control signals are provided. As illustrated in FIG. 1, the control signals provided to the asynchronous mode detection circuitry 110 include conventional control signals, such as a chip enable signal CE*, an address valid signal ADV*, an output enable signal OE*, and a write enable signal WE*. The asterisk "*" indicates that the respective control signal is an active low signal, that is, the signal is considered active when at a LOW logic level. The ADDR<0:n> signals and the CE*, ADV*, OE*, and WE* signals are conventional, and are known by those of ordinary skill in the art.

Further included in the detection circuit 100 is synchronous mode detection circuitry 120, which receives the CE*, ADV*, OE*, and WE* signals. The synchronous mode detection circuitry 120 also receives a periodic clock signal CLK that is used by the synchronous mode detection circuitry 120 to synchronize operation of the memory device. For example, the synchronous mode detection circuitry 120 includes control signal latches (not shown) that latch the logic state of the CE*, ADV*, OE*, and WE* signals in response to transitions of the CLK signal, such as the rising edge of the CLK signal, the falling edge of the CLK signal, or in some embodiments, on both the rising and falling edges of the CLK signal. The asynchronous mode detection circuitry 110 and the synchronous mode detection circuitry 120 are of conventional design known by those of ordinary skill in the art.

It will be appreciated the previously described control signals have been provided by way of example, and that alternative control signals may be provided to the asynchronous mode detection circuitry 110 and the synchronous mode detection circuitry 120 without departing from the scope of the present invention.

A refresh timer 130 is also included in the detection circuit 100. The refresh circuit 130 is coupled to receive a pulse PULSE_ASYNC from the asynchronous mode detection circuitry 110 and a pulse PULSE_SYNC from the synchronous control circuitry 110. As will be explained in more detail below, the refresh timer 130 generates an output pulse PULSE_OUT a time delay $t_d$ after the falling edge of the last (i.e., most recent) PULSE_ASYNC pulse from the asynchronous mode detection circuitry 110. However, in the event a PULSE_SYNC pulse is generated by the synchronous mode detection circuitry 120 prior to the time delay $t_d$ elapsing, the refresh timer 130 will be reset and deactivated to prevent a PULSE_OUT pulse from being generated by the refresh timer 130. A two-input Boolean logic OR gate 140 is coupled to receive the PULSE_OUT and PULSE_SYNC pulses from the refresh timer 130 and the synchronous mode detection circuitry 120, respectively. An output of the OR gate 140 is coupled to provide an activation pulse ACT_PULSE to conventional DRAM activation circuitry 150 in order to initiate an access operation in the DRAM memory core (not shown).

By way of background, a memory access operation is initiated in a conventional SRAM device by enabling the SRAM device with an active (LOW logic level) CE* signal, and asserting a memory address. In some applications, an ADV* signal is used to indicate to the SRAM that the memory address is valid, and can be latched to initiate the memory operation. The type of access, that is, whether a read operation or a write operation is executed, is controlled by the logic levels of the other control signals. For example, a read operation is typically executed in response to the WE* signal having a HIGH logic state at the time the memory address is asserted. In contrast, a write operation is executed in response to the WE* signal having a LOW logic state at the time the address is asserted. With respect to a read operation for an SRAM device, read data is expected to be returned from the memory device a certain time after the asserted memory address has been held valid for the minimum time. The maximum time required for the read data to be returned is typically referred to as the address access time $t_{AA}$. In the event a new address is asserted before the access operation is complete, the previous access operation is aborted, and a new access operation is initiated for the memory location of the newly asserted address.

As previously discussed, in a conventional DRAM memory core, accessing memory locations in the DRAM memory core is a destructive operation. That is, when a row of memory is accessed, the data stored by the memory cells of that row are essentially erased, and must be written back to the memory cells prior to the completion of the memory access cycle. As a result, it is typically the case that conventional DRAM memory cores are not well suited for use in memory devices that will be accessed in the manner of an SRAM device because of the asynchronous manner in which memory access operations can be initiated in the SRAM device. That is, although the previously described situation of asserting a new memory address prior to the completion of a memory access operation is easily accommodated by conventional SRAM memory cores, this is not the case with a conventional DRAM memory core. As previously explained, the destructive nature of an access operation for a conventional DRAM memory core requires that a memory access operation that is initiated must be allowed to complete or risk loss of data. The detection circuit 100 can be employed to accommodate the use of a DRAM memory core with a conventional SRAM memory interface.

The detection circuit 100, however, can be used in a memory device having a conventional DRAM memory core to convert randomly scheduled address transitions, which conventionally used to initiate SRAM access operations, into scheduled events that are suitable for conventional DRAM memory cores. The detection circuit 100 further provides a mechanism for memory devices having conventional DRAM memory cores to be accessed both asynchronously in the manner of an SRAM address interface as well as synchronously to provide the benefits of conventional synchronous DRAM devices. The operation of the detection circuit 100 will be discussed with respect to an asynchronous access operation of a conventional SRAM address interface, followed by a synchronous memory access operation, and then a memory access operation where an asynchronous access operation is immediately followed by a synchronous access operation. A memory access operation that includes transitioning from an asynchronous to a synchronous memory access operation can be referred to as a mixed mode operation. Embodiments of the present invention automatically detect transitions in mixed mode operations. That is, detection of asynchronous and synchronous memory access operations can be made without any externally supplied flags that instruct a memory device to expect either an asynchronous or synchronous memory access operation.

As previously discussed, a memory access to an SRAM device is initiated upon activating the memory device by a LOW CE* signal and asserting a memory address. Thus, upon receiving a newly asserted memory address and a LOW CE* signal, the asynchronous mode detection circuitry 110 generates a PULSE-SYNC pulse that is provided to the refresh timer 130 to initiate the time delay $t_d$. After the time $t_d$ has elapsed, the refresh timer 130 generates a PULSE_OUT pulse that is provided through the OR gate 140 as the ACT_PULSE pulse to the DRAM activation circuits 150. In response to receiving the ACT_PULSE, the DRAM activation circuits 150 initiate an access operation to the memory location in the DRAM memory core corresponding to the memory address asserted to the asynchronous mode detection circuitry 110.

The value of the refresh timer 130 will now be explained. The asynchronous mode detection circuitry 110 generates a PULSE_ASYNC pulse in response to receiving a new memory address, regardless of whether the new memory address is being asserted prior to the completion of a memory access cycle. The refresh timer 130 inserts a time delay $t_d$ of suitable length to ensure that any previously initiated memory access operation will have sufficient time to complete. In the event the refresh timer 130 is reset by the PULSE_ASYNC pulse generated by the asynchronous mode detection circuitry 110 before $t_d$ elapses, the time delay $t_d$ is reset so that the delay is measured from receipt of the most recent PULSE_ASYNC pulse. By selecting the time delay $t_d$ to be long enough to allow a memory access operation to complete, the refresh timer 130 ensures that a memory access operation will not be interrupted prior to its completion. That is, since the time $t_d$ is always reset upon the receipt of a PULSE_ASYNC pulse, the refresh timer 130 ensures that an ACT_PULSE (i.e., a PULSE_OUT pulse) will not be provided to the DRAM activation circuits 150 in response to the assertion of a memory address any sooner than the time $t_d$ has elapsed, which, as previously discussed, is selected to allow a memory access operation to complete. In a particular embodiment of the present invention, the delay $t_d$ is approximately 25 ns, which still allows for a memory device employing a DRAM memory core to have an access time $t_{AA}$ of 60 ns.

Figure 2:
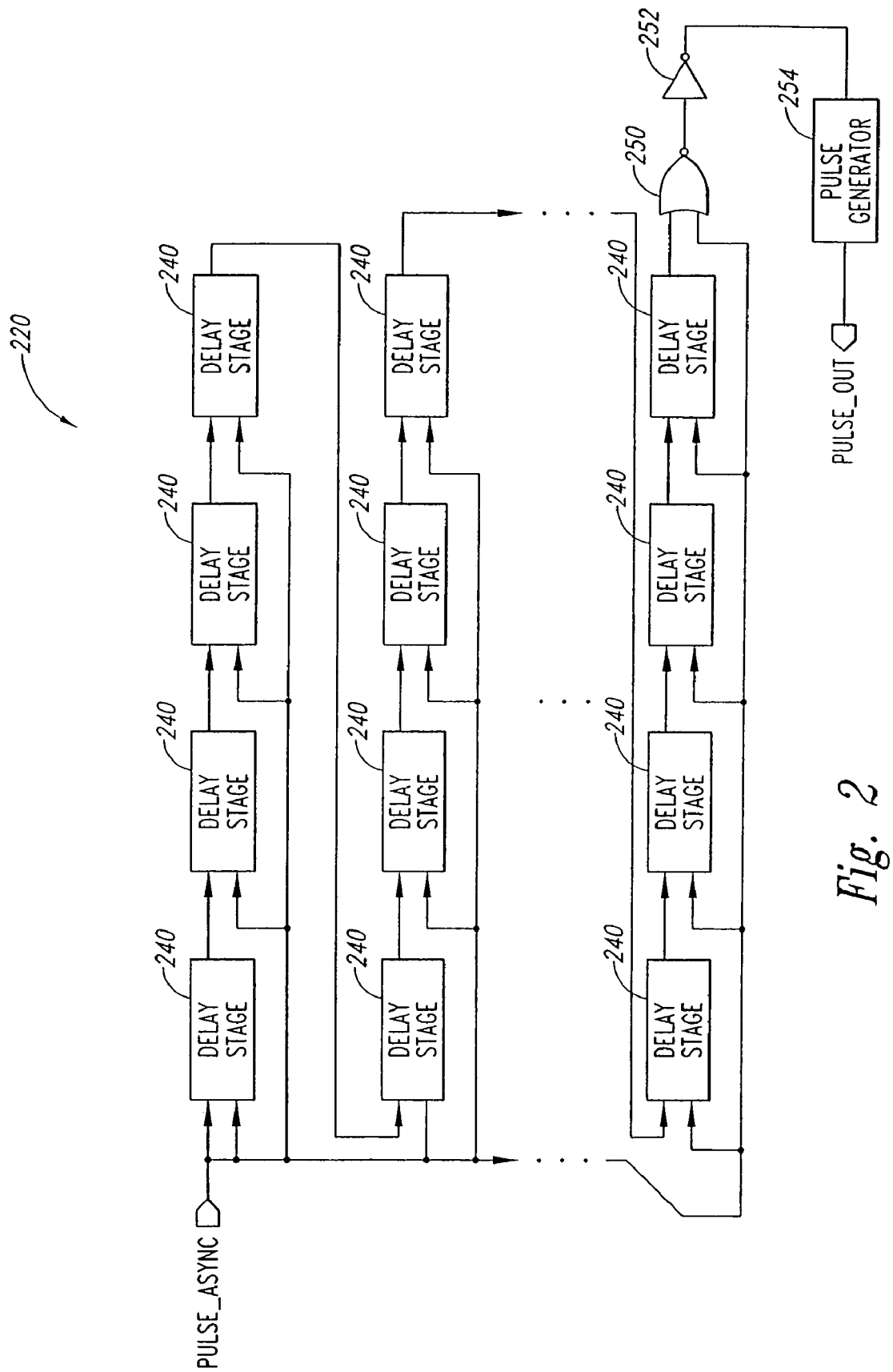
FIG. 2 is a functional block diagram of an embodiment of a delay circuit that can be used in the detection circuit of FIG. 1.

FIG. 2 illustrates a delay circuit timer 220 that can be included in the refresh timer 130 (FIG. 1). The delay circuit 220 includes a plurality of delay stages 240. Each delay stage 240 has a delay input and a reset input, and further has a delay output. As will be explained in more detail below, a reset circuit (not shown) also included in the refresh timer will be used to reset the delay circuit timer 220 in response to receiving a PULSE_SYNC pulse from the synchronous mode detection circuit 120. However, the reset circuit, which can be designed by those ordinarily skilled in the art, will not be discussed with respect to the delay circuit timer 220 in order to avoid unnecessarily complicating the description of the delay circuit timer 220.

In operation, a delay stage 240 provides an output signal that is similar to the signal applied to the delay input except that it is delayed by a time $t_{dd}$. A first delay stage 240 receives the PULSE_ASYNC signal at both its delay input and reset input. Subsequent delay stages 240 are coupled such that the delay input is coupled to the delay output of the previous delay stage 240. The reset input of each of the delay stages 240 is coupled to receive the PULSE_ASYNC signal, and the delay output of the last delay stage 240 is coupled to a first input of a two-input NOR gate 250. A second input of the NOR gate 250 is coupled to receive the PULSE_ASYNC signal. An output of the NOR gate 250 is coupled to a conventional pulse generator 254 through an inverter 252. The pulse generator 254 generates the pulse PULSE_OUT in response to the falling edge of the signal output by the inverter 252. The PULSE_OUT signal, as previously mentioned, is provided to the DRAM activation circuits 150 through the OR gate 140 to start an access operation to a conventional DRAM memory core.

In operation, the delay circuit 220 generates a PULSE_OUT pulse a time delay $t_d$ after the falling edge of the most recent PULSE_ASYNC pulse. The time delay $t_d$ is approximately the sum of the delay $t_{dd}$ of each delay stage 240. In an effort to simplify explanation of the delay circuit 220, any gate delays have been ignored. However, it will be appreciated that some time will be added to the time delay $t_d$ because of the gate delays. When the delay circuit 220 receives an PULSE_ASYNC pulse, on the falling edge of the PULSE_ASYNC pulse, the delay circuit begins counting the time delay $t_d$. That is, for the first delay stage 240 in the chain, its delay output will go LOW $t_{dd}$ after the falling edge of the PULSE_ASYNC pulse. The delay output of the second delay stage 240 will go LOW $t_{dd}$ after the falling edge of the delay output of the first delay stage 240. Thus, the falling edge of the PULSE_ASYNC pulse will trickle through the chain of delay stages 240 until being applied to the input of the NOR gate 250. Note that during this time, the output of the inverter 252 has remained HIGH. Not until the delay output of the last delay stage 240 goes LOW, which occurs $t_d$ after the falling edge of the PULSE_ASYNC signal, will the output of the inverter 252 go LOW. When this does occur, the pulse generator 254 then generates a PULSE_OUT pulse.

In the event a second PULSE_ASYNC pulse is received by the delay circuit 220 before the $t_d$ timing count has elapsed, the delay stages 240 of the timing chain are reset by causing the delay output of each of the delay stages 240 to go HIGH again in response to the new PULSE_ASYNC pulse. As a result, the $t_d$ countdown will begin again in response to the falling edge of the new PULSE_ASYNC pulse, as previously described. In effect, the pulse generator 254 will not generate a PULSE_OUT pulse until $t_d$ after the falling edge of the last PULSE_ASYNC pulse provided to the delay circuit 220.

A more detailed description of the delay circuit 220 is provided in commonly assigned, co-pending U.S. patent application Ser. No. 10/102,221, entitled ASYNCHRONOUS INTERFACE CIRCUIT AND METHOD FOR A PSEUDO-STATIC MEMORY DEVICE to Lovett et al., filed Mar. 19, 2002. It will be appreciated, however, that the refresh timer 130 can include delay circuitry other than that shown in FIG. 2, that is well known by those of ordinary skill in the art.

With respect to a synchronous memory access operation, the detection circuit 100 includes synchronous mode detection circuitry 120 that can be used to initiate synchronous memory access operations of a conventional DRAM memory core. With reference to FIG. 1, the combination of the logic levels of control signals and provision of a periodic clock signal CLK to the synchronous mode detection circuitry 120 initiate such an operation. The synchronous mode detection circuitry 120 is conventional in design, and the design of suitable synchronous mode detection circuitry 120 is known by those of ordinary skill in the art. Upon receiving the correct combination of logic signals of the control signals, and provision of a CLK signal, the synchronous control circuitry generates a PULSE_SYNC pulse that is provided to the refresh timer 130 and the OR gate 140. The resulting PULSE_SYNC pulse is provided to the DRAM activation circuits 150 through the OR gate 140 as the ACT_PULSE, which initiates memory access to the DRAM memory core. It will be appreciated that the synchronous mode detection circuitry 120 provides internal control signals (not shown) in addition to the PULSE_SYNC pulse shown in FIG. 1 in order to execute a synchronous memory access operation. However, the internal control signals are conventional in nature, and have not been shown in order to avoid unnecessarily obscuring the invention.

As an example of a combination of control signals that can be used to initiate a synchronous memory access operation, in a particular embodiment of the present invention, a synchronous memory write operation is requested when the CE* and WE* signals are at a logic LOW, the OE* signal is at a HIGH logic level, and an active CLK signal is provided to the synchronous control circuitry. The requested memory address is asserted, and the ADV* signal is LOW to indicate that the memory address is valid and should be latched by an address buffer (not shown). After initiation of the synchronous memory write operation, the ADV* and WE* signals can return to a HIGH logic level. A burst write operation can continue as long as the CE* signal is at a LOW logic level and an active CLK signal is provided to the synchronous mode detection circuit 120.

As previously mentioned, the PULSE_SYNC pulse generated by the synchronous mode detection circuitry 120 is provided to the refresh timer 130 as well as to the OR gate 140. As will be explained below, the PULSE_SYNC pulse is provided to reset the refresh timer 130 before a PULSE_OUT pulse can ever be generated by the refresh timer 130. Instead, the PULSE_SYNC pulse provided to the OR gate 140 by the synchronous mode detection circuitry 120 is used as the ACT_PULSE pulse to initiate a synchronous memory access operation immediately.

Operation of the detection circuit 100 during a mixed mode operation will be explained with reference to the timing diagram of FIG. 3. The timing diagram illustrates the relative timing of various signals applied to the detection circuit 100 in transitioning from an asynchronous memory read operation to a synchronous memory write operation. The timing diagram of FIG. 3 is being provided by way of example, and should not be interpreted as limiting the scope of the present invention to a particular embodiment.

The asynchronous memory access cycle is initiated at a time T0 by providing a LOW logic level CE* signal (i.e., chip enable), asserting a memory address and strobing the ADV* signal LOW to indicate that the memory address input is valid. The asynchronous mode detection circuitry 110 (FIG. 1) generates a PULSE_ASYNC pulse in response to the assertion of the memory address, which begins a time delay $t_d$ 330 of the refresh timer 130. As shown in the timing diagram of FIG. 3, the time delay $t_d$ 330 is approximately 25 ns. When the time delay $t_d$ 330 elapses, a PULSE_OUT pulse is generated at a time T1 by the refresh timer 130 and provided through the OR gate 140 to the DRAM activation circuits 150 as an ACT_PULSE pulse to initiate a memory access operation in the DRAM memory core. After the time $t_{AA}$ elapses, that is, the minimum access time for the memory device, the OE* signal (i.e., output enable) is made active by changing it to a logic LOW level at a time T2. In response, valid read data 340 is provided at the input/output (IO) terminals of the memory device. At a time T3, the IO terminals are placed in a high impedance state by returning the OE* signal to a HIGH logic level, and the memory device is put in a standby state by changing the CE* signal to a HIGH logic level. The time T3 represents the end of the asynchronous memory access cycle.

Figure 3:
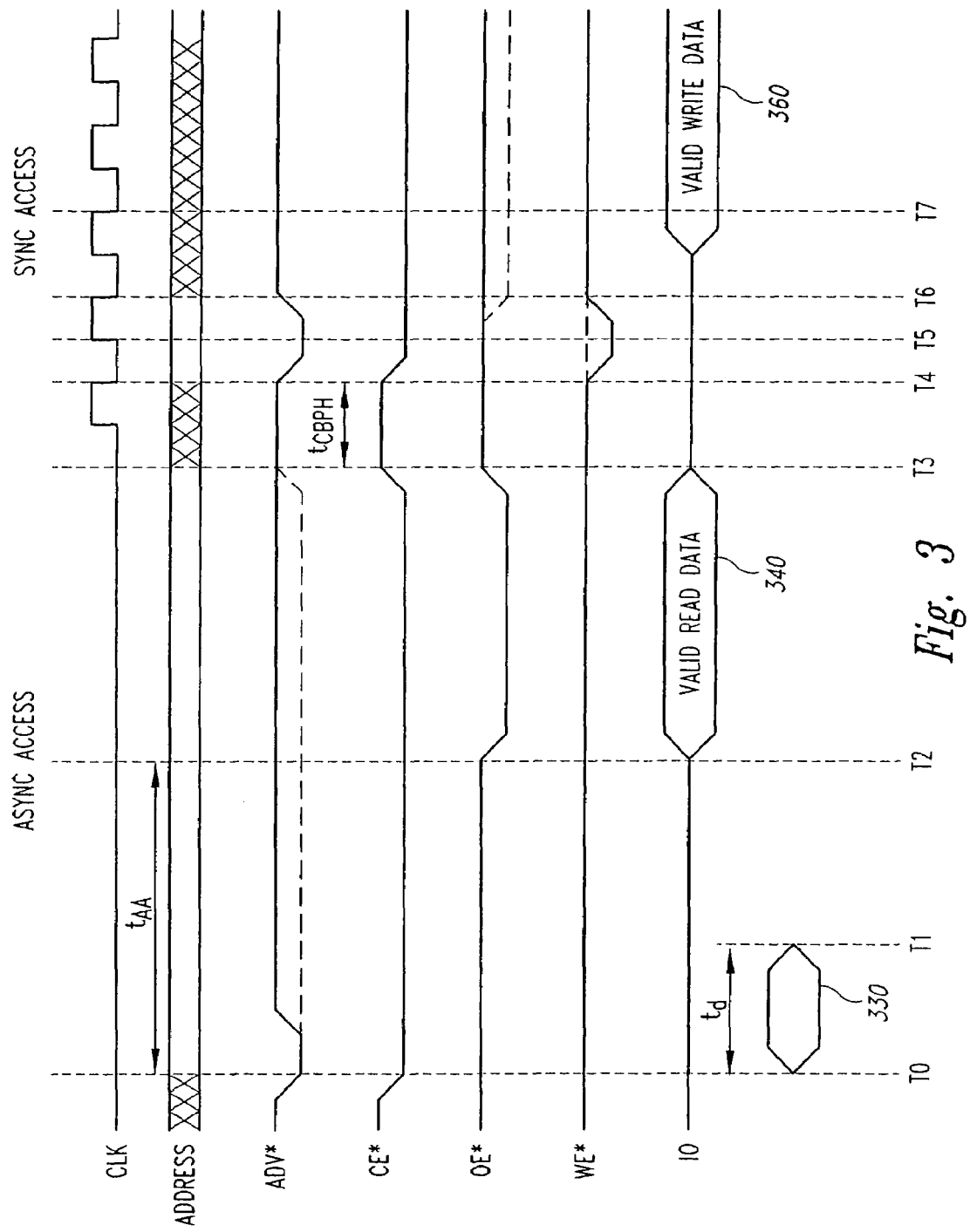
FIG. 3 is a signal timing diagram illustrating various signals applied to the detection circuit of FIG. 1.

In the present example shown in FIG. 3, the transition from the asynchronous memory access mode to a synchronous memory access mode occurs on the rising edge of the CLK signal following a time T4, that is, when the CE* signal becomes active, or more specifically, when the CE* signal goes LOW. As will be discussed in more detail below, when the CE* signal becomes active at the time T4, it is assumed that an asynchronous memory access operation will be executed until a rising edge of the CLK signal in combination with the ADV* signal is detected. At that time, the asynchronous memory access operation is cancelled, and a synchronous memory access operation is initiated instead. It will be appreciated by those ordinarily skilled in the art that where the time delay $t_d$ 330 is approximately 25 ns, a maximum time of 25 ns can elapse from the time the CE* signal becomes active at the time T4 and the time when the rising edge of the CLK signal is detected. Otherwise, the asynchronous memory access operation that is assumed to have been initiated will begin in the DRAM memory core before the synchronous memory access operation.

At the time T4, the memory device is enabled by changing the logic level of the CE* signal to LOW, and a write operation is indicated by strobing the WE* signal LOW. A memory address is also asserted and the ADV* signal is strobed LOW to signal that the address input is valid. At a time T5, a synchronous write operation in the DRAM memory core is initiated when, in response to a rising edge of the CLK signal, the synchronous mode detection circuitry 120 (FIG. 1) detects the active CE* and WE* signals and generates a PULSE_SYNC pulse that is provided to the DRAM activation circuits 150 through the OR gate 140. The memory address is latched on the rising edge of the CLK signal as well.

At a time T6, the ADV* and WE* are returned to a HIGH logic level, while the CE* signal remains at a LOW logic level to indicate that the requested synchronous memory write operation should not be terminated.

At the time T4, as part of enabling the memory device, the asynchronous mode detection circuitry 110, which also received the CE*, ADV*, and address signals, will generate a PULSE_ASYNC pulse. The PULSE_ASYNC pulse is generated in response to the CE* signal becoming active at the time T4, and an asynchronous memory access operation is started on the refresh timer 130 (FIG. 1). Before the asynchronous memory access operation is initiated in the DRAM memory core by the generation of the PULSE_OUT pulse after the time delay $t_d$ elapses, a PULSE_SYNC pulse generated by the synchronous detection circuitry 120 at a time T5 cancels the queued asynchronous memory access operation. The PULSE_ASYNC pulse is automatically generated in response to the assertion of the memory address. As a result, the refresh timer will begin the time delay. Consequently, in order to prevent a PULSE_OUT pulse from being generated and interrupting the synchronous memory write operation, which as previously discussed is initiated at the time T5, the refresh timer 130 is reset and disabled by the PULSE_SYNC pulse generated by the synchronous mode detection circuitry 120. As a result, a PULSE_OUT pulse is never generated by the refresh timer 130.

At a time T7, write data 360 present on the IO terminals is latched and written to the location in the DRAM memory core corresponding to the memory address latched at the time T5. As previously discussed, while the CE* signal remains at a LOW logic level, the synchronous memory write operation will continue. The synchronous memory access operations can be terminated by returning the CE* signal to a HIGH logic level, and transition back to an asynchronous memory access can accomplished by disabling the CLK signal.

Figure 4:
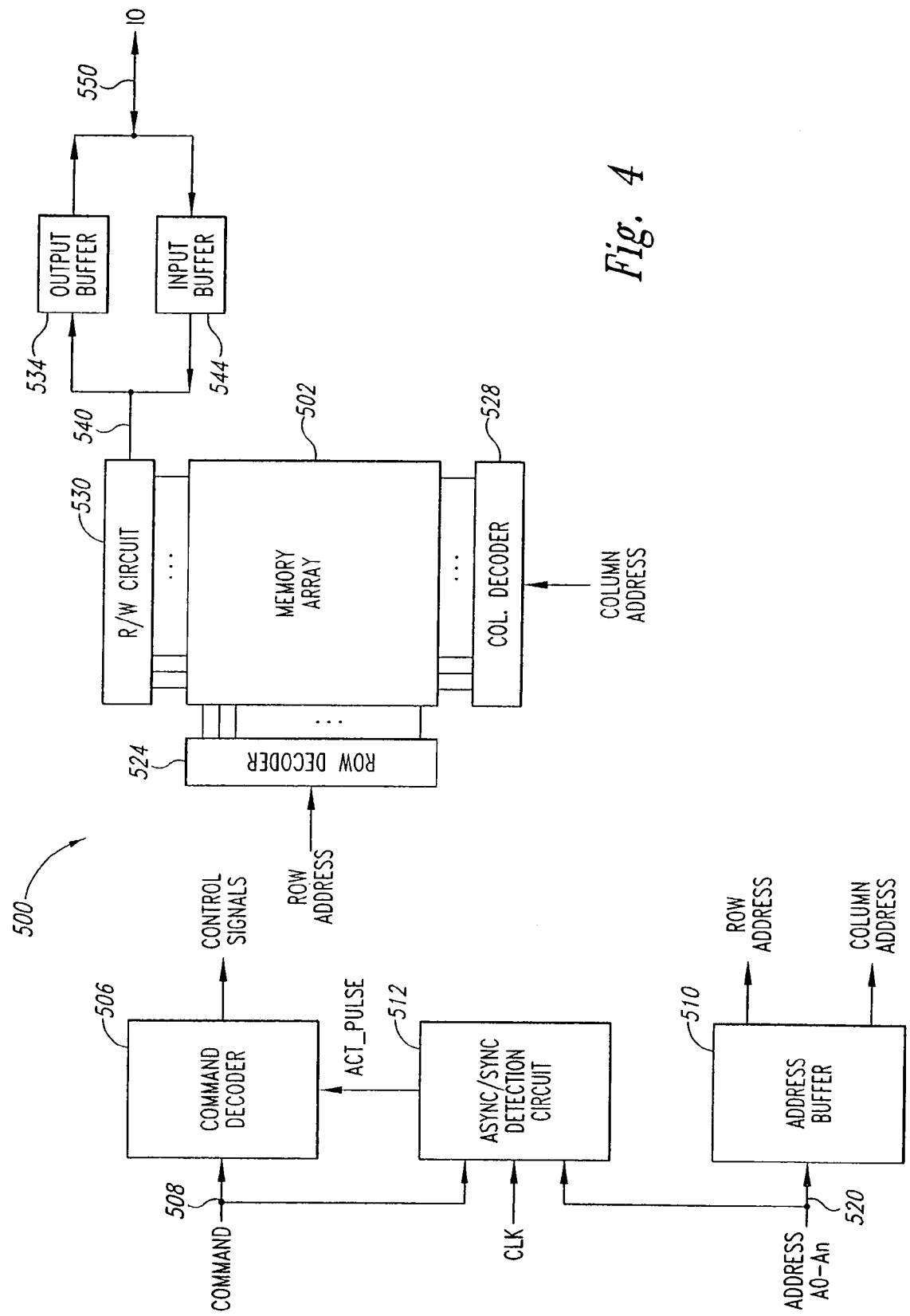
FIG. 4 is a functional block diagram of a portion of a memory device including an asynchronous/synchronous detection circuit according to an embodiment of the present invention.

FIG. 4 illustrates a portion of a memory device 500 according to an embodiment of the present invention. The memory device 500 is an asynchronous pseudo-static SRAM that includes a conventional DRAM memory array 502. The memory device 500 can be operated asynchronously or synchronously. The memory device 500 includes a command decoder 506 that receives memory commands through a command bus 508 which generates internal control signals within the memory device 500 to carry out various memory operations. The command bus 508 is also coupled to an asynchronous/synchronous detection circuit 512 that is in accordance with an embodiment of the present invention. Examples of the signals received over the command bus 508 include CE*, ADV*, OE*, and WE* signals, as previously described. However, it will be appreciated by those ordinarily skilled in the art that changes to the particular signals provided to the memory device 500 over the command bus 508 will not depart from the scope of the present invention. Row and column address signals are provided to an address buffer 510 of the memory device 500 through an address bus 520, as well as to the detection circuit 512.

As previously described, the detection circuit 512 generates an ACT_PULSE pulse to initiate an access operation to the memory array 502. Although previously described as being provided to DRAM activation circuits 150 (FIG. 1), as illustrated in FIG. 4, the ACT_PULSE pulse is provided to the command decoder 506 to initiate a memory access operation in FIG. 5. It will be appreciated, however, that the ACT_PULSE signal can be provided to alternative or additional functional blocks of a conventional memory device without departing from the scope of the present invention.

The row and column addresses are provided by the address buffer 510 for decoding by a row address decoder 524 and a column address decoder 528, respectively. Memory array read/write circuitry 530 are coupled to the array 502 to provide read data to a data output buffer 534 via a input-output data bus 540. Write data are applied to the memory array 502 through a data input buffer 544 and the memory array read/write circuitry 530. The command controller 506 responds to memory commands applied to the command bus 508 to perform various operations on the memory array 502. In particular, the command controller 506 is used to generate internal control signals to read data from and write data to the memory array 502. The data read from the memory array 502 are transferred to the output buffer 534 and provided on data input/output (IO) lines 550. In a write operation, the addressed memory cell is accessed and data provided on the IO lines 550 to the data input buffer 544 are stored in the memory array 502.

Figure 5:
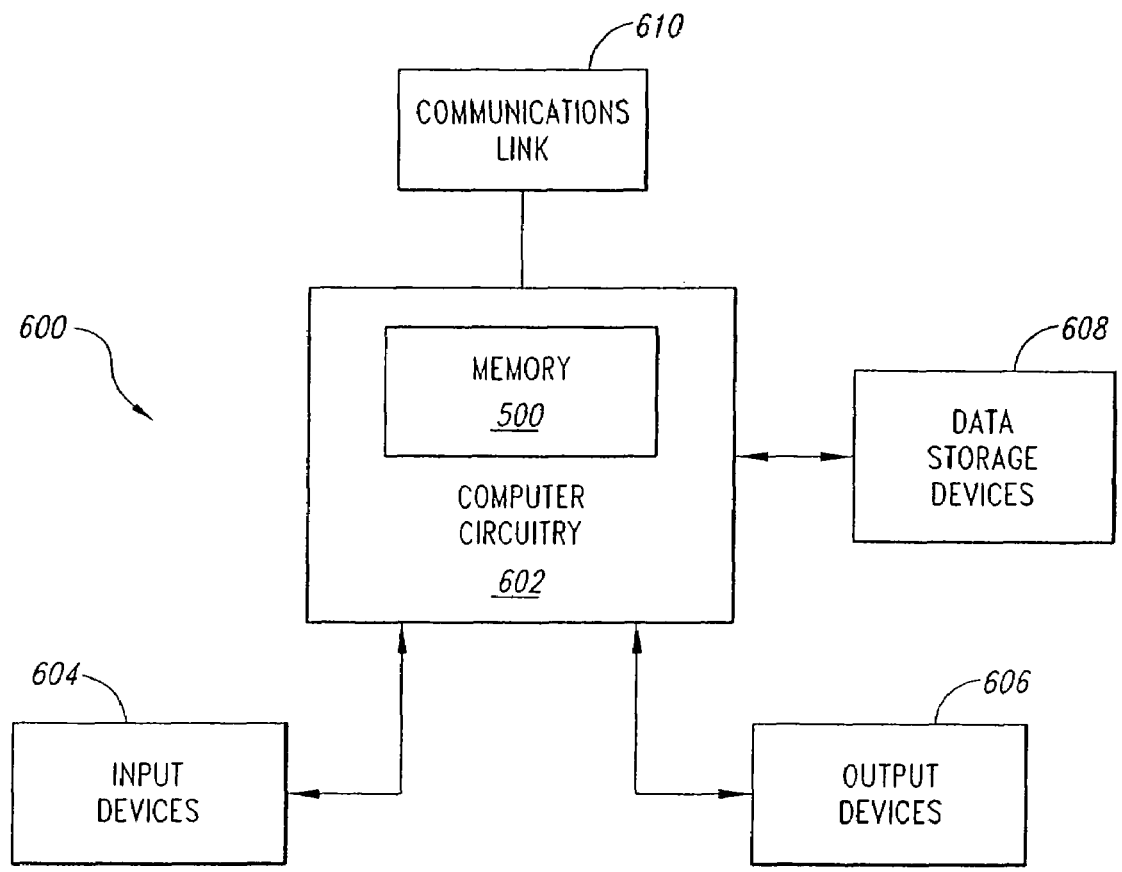
FIG. 5 is a functional block diagram of a computer system including memory devices of FIG. 4.

FIG. 5 is a block diagram of a computer system 600 including computer circuitry 602 that contains the memory device 500 of FIG. 4. The computer circuitry 602 performs various computing functions, such as executing specific software to perform specific calculations or tasks. In addition, the computer system 600 includes one or more input devices 604, such as a keyboard, coupled to the computer circuitry 602 to allow an operator to interface with the computer system. Typically, the computer system 600 also includes one or more output devices 606 coupled to the computer circuitry 602, such output devices typically being a display device. One or more data storage devices 608 are also typically coupled to the computer circuitry 602 to store data or retrieve data. Examples of storage devices 608 include hard disks and non-volatile memory. The computer system 600 also includes a wireless communication link 610 through which the computer circuitry can send and receive data through a wireless medium. The computer circuitry 602 is typically coupled to the memory device 500 through appropriate address, data, and control busses to provide for writing data to and reading data from the memory.

From the foregoing it will be appreciated that, although specific embodiments of the invention have been described herein for purposes of illustration, various modifications may be made without deviating from the spirit and scope of the invention. For example, the embodiment of the present invention described in FIG. 1 includes a two-input OR gate 140 that provides the ACT_PULSE pulse to the DRAM activation circuits 150 to initiate a memory access operation based on either a PULSE_OUT pulse from the refresh timer 130 or a PULSE_SYNC pulse from the synchronous mode detection circuitry 120. However, in an alternative embodiment of the present invention, the OR gate 140 will not be included, and the PULSE_OUT and PULSE_SYNC pulses will be provided to DRAM activation circuitry directly to initiate either an asynchronous memory access operation or a synchronous memory access operation, respectively. Moreover, the embodiment of FIG. 1 illustrates separate functional blocks for the asynchronous mode detection circuitry 110, synchronous mode detection circuitry 120, refresh timer 130, OR gate 140 and DRAM activation circuits 150. However, it will appreciated by those ordinarily skilled in the art that the various functional blocks may be combined into different arrangements than that shown in FIG. 1, and still remain in the scope of the present invention. Accordingly, the invention is not limited except as by the appended claims.

The invention claimed is:

1. A mode detection circuit for initiating a memory access operation in a memory device receiving memory address signals and control signals, the detection circuit comprising:
   a first mode detection circuit operable to generate a first mode detection signal to be provided at a first output node in response to receipt of the memory address signals and receipt of control signals requesting an asynchronous memory access operation;
   a second mode detection circuit operable to generate a second mode detection signal to be provided at a second output node in response to receipt of an active clock signal and receipt of control signals requesting a synchronous memory access operation;
   a delay circuit coupled to the first and second mode detection circuits, the delay circuit including a timing circuit operable to provide a delayed mode detection signal a time delay after receiving a first occurrence of the first mode detection signal, the delay circuit further operable to interrupt provision of the delayed mode detection signal in response to the second mode detection signal, the delay circuit including a reset circuit operable to restart the timing circuit upon receiving a second occurrence of the first mode detection signal during the time delay; and
   an output circuit coupled to the second mode detection circuit and the delay circuit, the output circuit operable to provide an activation signal to initiate a memory access operation in response to the delayed mode detection signal or the second mode detection signal.

2. The mode detection circuit of claim 1 wherein the output circuit comprises a two-input OR gate.

3. The mode detection circuit of claim 1 wherein the delay circuit comprises:
   a chain of delay stages, each delay stage having first and second inputs and an output and operable to delay a falling edge of a signal applied to either of the first or second inputs from propagating to its output by a stage time delay; and
   a reset circuit coupled to the chain of delay stages and operable to disable the chain of delay stages to prevent output of the delayed mode detection signal in response to receipt of the second mode detection signal.

4. The mode detection circuit of claim 1 wherein the delay circuit comprises a delay circuit having a time delay that is sufficient to allow a memory access operation to complete.

5. The mode detection circuit of claim 1 wherein the second mode detection circuit comprises a mode detection circuit operable to generate a second mode detection signal in response to receipt of control signals requesting a synchronous memory access operation and a rising edge of the clock signal.

6. A mode detection circuit for initiating a memory access operation in a memory device, the detection circuit comprising:
   a synchronous mode detection circuit operable to generate a first memory activation pulse in response to receipt of command signals corresponding to a request for a synchronous memory operation;
   an asynchronous mode detection circuit operable to generate a second memory activation pulse after expiration of a minimum delay after receiving a first command signal corresponding to a first request for an asynchronous memory operation unless prior to expiration of the minimum delay at least one of a second command signal corresponding to a second request for an asynchronous memory operation and a request for a synchronous memory operation is received; and
   an output circuit operable to provide an activation signal to initiate a memory access operation in response to either of the first and second memory activation pulses.

7. The mode detection circuit of claim 6 wherein the command signals corresponding to a request for a synchronous memory operation include a clock signal.

8. The mode detection circuit of claim 7 wherein the synchronous mode detection circuit is configured to generate the first memory activation pulse in response to receipt of command signals corresponding to a request for a synchronous memory operation and a rising edge of the clock signal.

9. The mode detection circuit of claim 6 wherein the asynchronous mode detection circuit comprises:
   a pulse generator operable to generate a pulse in response to receipt of the command signals corresponding to a request for an asynchronous memory operation; and
   a delay circuit coupled to the pulse generator and operable to generate the memory operation activation pulse a time delay following receipt of a last received pulse from the pulse generator.

10. The mode detection circuit of claim 9 wherein the delay circuit comprises:
    a chain of delay stages, each delay stage having first and second inputs and an output and operable to delay a falling edge of a signal applied to either of the first or second inputs from propagating to its output by a stage time delay; and
    a reset circuit coupled to the chain of delay stages and operable to disable the chain of delay stages to suppress output of the memory operation activation pulse in response to generation of the first memory activation pulse.

11. A mode detection circuit for initiating a memory access operation in a memory device receiving memory address signals and control signals, the detection circuit comprising:
    a first mode detection circuit operable to generate a first mode detection signal to be provided at a first output node in response to receipt of the memory address signals and receipt of control signals requesting an asynchronous memory access operation;
    a second mode detection circuit operable to generate a second mode detection signal to be provided at a second output node in response to receipt of an active clock signal and receipt of control signals requesting a synchronous memory access operation;
    a delay circuit coupled to the first and second mode detection circuits, the delay circuit operable to provide a delayed mode detection signal after expiration of a minimum delay after receiving a first occurrence of the first mode detection signal unless at least one of a second occurrence of the first mode detection signal and a second mode detection signal is generated prior to expiration of the minimum delay; and
    an output circuit coupled to the second mode detection circuit and the delay circuit, the output circuit operable to provide an activation signal to initiate a memory access operation in response to the delayed mode detection signal or the second mode detection signal.

12. The mode detection circuit of claim 11 wherein the delay circuit comprises:
    a chain of delay stages, each delay stage having first and second inputs and an output and operable to delay a falling edge of a signal applied to either of the first or second inputs from propagating to its output by a stage time delay; and a reset circuit coupled to the chain of delay stages and operable to disable the chain of delay stages to prevent output of the delayed mode detection signal in response to receipt of the second mode detection signal.

13. The mode detection circuit of claim 11 wherein the delay circuit comprises a delay circuit having a time delay that is sufficient to allow a memory access operation to complete.

14. The mode detection circuit of claim 11 wherein the second mode detection circuit comprises a mode detection circuit operable to generate a second mode detection signal in response to receipt of control signals requesting a synchronous memory access operation and a rising edge of the clock signal.

15. A mode detection circuit for initiating a memory access operation in a memory device receiving memory address signals and control signals, the detection circuit comprising:

an asynchronous detection circuit operable to generate an asynchronous mode signal upon receiving control signals corresponding to an asynchronous memory request;

a synchronous detection circuit operable to generate a synchronous mode signal upon receiving control signals corresponding to a synchronous memory request;

a timer coupled to the asynchronous and synchronous detection circuits, the timer operable to provide a timer output signal a minimum delay period after receiving a first occurrence of the asynchronous mode signal unless a synchronous mode signal is received prior to expiration of the minimum delay period, the timer further operable to restart the minimum delay period after receiving a second occurrence of the asynchronous mode signal prior to expiration of the minimum delay period; and an output coupled to timer output and the synchronous detection circuit and configured to provide a detection circuit output upon detecting either of the timer output signal and the synchronous mode signal.

16. The mode detection circuit of claim 15 wherein the control signals include one or more of chip enable, write enable, output enable, and address valid signals.

17. The mode detection circuit of claim 15 wherein the synchronous detection circuit receives a clock signal.

18. The mode detection circuit of claim 15 wherein the timer restarts the delay period upon receiving the subsequent asynchronous mode signal prior to expiration of the minimum delay period.

19. The mode detection circuit of claim 15 wherein a DRAM memory core is coupled to the mode detection circuit to perform memory access operations upon detection of the detection circuit output, the minimum delay period corresponding to a completion time for a memory access operation in the DRAM memory core.

20. The mode detection circuit of claim 19 wherein the minimum delay period is about 25 nanoseconds.

21. The mode detection circuit of claim 15, wherein the timer comprises a chain of delay stages, each delay stage having first and second inputs and an output and operable to delay a falling edge of a signal applied to either of the first or second inputs from propagating to its output by a stage time delay; and a reset circuit coupled to the chain of delay stages and operable to disable the chain of delay stages to suppress output of the memory operation activation pulse in response to generation of the asynchronous mode signal by the synchronous operation command detection circuit.

* * * * *

UNITED STATES PATENT AND TRADEMARK OFFICE
CERTIFICATE OF CORRECTION

PATENT NO. : 7,506,126 B2
APPLICATION NO. : 11/354786
DATED : March 17, 2009
INVENTOR(S) : Lovett It is certified that error appears in the above-identified patent and that said Letters Patent is hereby corrected as shown below:

On the title page, item (57), under "Abstract", in column 2, line 3, after "device" insert -- . --.

On the title page, item (57), under "Abstract", in column 2, line 7, delete "An" and insert -- A --, therefor.

Signed and Sealed this

Twenty-third Day of June, 2009

JOHN DOLL
*Acting Director of the United States Patent and Trademark Office*